United States Patent [19]

Redgrave

[11] Patent Number: 5,287,301
[45] Date of Patent: Feb. 15, 1994

[54] STATIC RAM CELL

[75] Inventor: Jason Redgrave, Mountain View, Calif.

[73] Assignee: Vitesse Semiconductor Corporation, Camarillo, Calif.

[21] Appl. No.: 797,228

[22] Filed: Nov. 25, 1991

[51] Int. Cl.$^5$ .............................................. G11C 11/00
[52] U.S. Cl. .................................. 365/154; 365/156; 365/190; 365/202
[58] Field of Search ............... 365/154, 156, 190, 202

[56] References Cited

U.S. PATENT DOCUMENTS

| | | | |
|---|---|---|---|
| 4,779,230 | 10/1988 | McLaughlin | 365/190 |
| 4,939,693 | 7/1990 | Tran | 365/190 |
| 4,995,000 | 2/1991 | Terrell | 365/154 |

Primary Examiner—Eugene R. LaRoche
Assistant Examiner—Tan Nguyen
Attorney, Agent, or Firm—William J. Benman, Jr.

[57] ABSTRACT

A static RAM cell in which the load devices are moved from the state nodes to outer nodes of a cross-coupled pair of transistors in first and second driver elements (33 and 35). Each driver element has a first (T1A or T3A) and a second (T1 or T3) transistor and a resistive device (42 or 44). Each transistor has first, second and third terminals, with the second terminals being the input terminals. A first terminal of the first transistor (T1A) of the first driver element (33) is connected to the resistive element (42) at a first node. A first terminal of the first transistor (T3A) of the second driver element is connected to the resistive element (44) at a second node. A first terminal of the second transistor (T1) of the first driver element (33) is connected to the resistive device (42) at a third node. A first terminal of the second transistor (T3) of the second driver element is connected to the resistive device (44) at a fourth node. The input terminals of the first and second transistors (T1A and T1) of the first driver element (33) are connected to the second node and the input terminals of the first and second transistors (T3A and T3) of the second driver element (35) are connected to the first node. The third terminals of the first and second transistors of the first and second driver elements are connected to a first source of common potential. A first load device (26) is connected to a second source of common potential on one end and is connected to the third node on a second end. Likewise, a second load device (28) is connected to the second source of common potential on one end and to the fourth node on the second end.

13 Claims, 2 Drawing Sheets

STATIC RAM CELL

BACKGROUND OF THE INVENTION

1. Field of the Invention

The present invention relates to memory devices. More specifically, the present invention relates to static random access memory (RAM) cells.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

As described in S. M. Sze, *VLSI Technology*, McGraw-Hill, NY, pp. 473–478 (1983) a conventional four-transistor (4T) RAM cell consists of a two cross-coupled transistors, each with a resistive-load, plus two access transistors (also known as word-line, transfer gate, or pass-gate transistors). The two cross-coupled transistors are known as driver or pull-down transistors. As illustrated in FIG. 1, two state nodes exist in the conventional cell, node 1 and node 2. Node 1 connects one load, the source of one pass-gate transistor, T2, the drain of one driver transistor, T1, and the gate of the other driver transistor T3. Node 2 connects the other load, the source of the other pass-gate transistor, T4, the drain of T3, and the gate of T1.

In static RAM cells, data retention reliability is a direct function of cell stability and noise margin. Noise margin is measured by how well one driver transistor, say T1, holds a low logic level. This low level must remain below the threshold voltage of the other driver transistor, T3, to insure that T3 is off, and therefore to prevent the cell from flipping. If node 1 exceeds the threshold of T3, then T3 will conduct and easily degrade the high level on node 2.

The worst case for cell logic low level is during the time the word line is being selected and the transfer gate, T2, begins to pull up against T1. A good logic low on node 1, and therefore good noise margin and stability, is achieved by making T2 small in size (width to length) and therefore high in resistance with respect to T1.

However, the speed with which the cell develops differential to a sense amplifier is determined by the rate at which the bit line capacitance is discharged through the T2, T1 pair and therefore by the size of the transfer gate, T2. (The sense amp is a differential amplifier whose inputs are BIT and $\overline{\text{BIT}}$.) For high cell pull current, T2 should be sized large with respect to T1. High cell pull current results in fast cell read access time, since that current is responsible for slewing the bit-line capacitance and developing differential to the sense amplifier.

These conflicting transfer gate sizing requirements for speed and stability limit the ultimate performance of the traditional cell configuration. The cell must be designed to meet a minimum stability level for reliable operation over process variations and operating conditions. Once stability is designed for, cell pull current is fixed and cannot be increased.

This problem is exacerbated in enhancement/depletion mode GaAs RAM design, since the enhancement FET threshold voltage has a strong dependence on temperature and drops significantly at elevated operating temperatures. This forces the transfer gate to further decrease in size to maintain cell stability over wide temperature ranges. This decreased size slows the cell read access time.

Thus, the conventional approach is drastically limited in flexibility to address this tradeoff of speed versus stability. Many static RAM manufacturers have simply decreased the pull-down driver to transfer gate ratio to get improved cell speed. However, these designs are, as a result, plagued with marginally stable cells and "weak bits" which are hard to detect and test.

Another alternative to speeding up the cell is to maintain an adequate cell ratio for stability and then scale FET sizes up to get increased cell pull current. However, this increases chip size and power and is only marginally effective, since the load capacitance the cell must drive scales with cell size as well. There may be no real improvement in cell speed by this method.

Thus, there has been a need for a design which offers high speed and stability in a GaAs static RAM cell, without compromise of one or the other property. This need is addressed by U.S. Pat. No. 4,995,000 issued Feb. 19, 1991 to W. C. Terrell entitled Static RAM Cell with High Speed and Stability. This reference discloses an FET-based static RAM cell design which offers both high speed and stability through the use of isolation devices. The isolation devices allow the pulldown devices with the cell to pull substantially more current while maintaining a good low level on the cross-coupled pair. This keeps the gates of the transistors in the cross-coupled pair as negative as possible which, in turn, reduces subthreshold current (leakage) therethrough. Hence, stability requirements are decoupled from cell pull current requirements.

However, with the Terrell design, the load devices are connected to the state nodes where node information is stored as voltages. When the cell is written, current must be sunk through the isolation device to an output line. If the resistance of the isolation device is large (which is desirable for stability), then a large voltage is generated across the isolation device making it difficult to pull the node with state low enough to flip the cell. This impedes the speed of operation of the device.

Thus, while the Terrell patent provides for significant improvements in the art, there remains an ongoing need for further improvements in static RAM cell design.

SUMMARY OF THE INVENTION

The need in the art is addressed by the present invention which provides a static RAM cell design in which the load devices are moved from the state nodes to outer nodes of a cross-coupled pair of two transistor driver elements. Each driver element has a first and a second transistor and a resistive isolator device. Each transistor has first, second and third terminals, with the second terminals being the input terminals thereof. A first terminal of the first transistor of the first driver element is connected to the resistive device thereof at a first node. A first terminal of the first transistor of the second driver element is connected to the resistive device thereof at a second node. A first terminal of the second transistor of the first driver element is connected to the resistive device thereof at a third node. A first terminal of the second transistor of the second driver element is connected to the resistive device thereof at a fourth node. The input terminals of the first and second transistors of the first driver element (33) are connected to the second node and the input terminals of the first and second transistors of the second driver element are connected to the first node. The third terminals of the first and second transistors of the first and second isolation devices are connected to a first source of common potential. A first load device is connected to a second source of common potential on one end thereof and is connected to the third node, the outside node, on a second end thereof. Likewise, a second load device is connected to the second source of common potential on one end and to the fourth node, an outside node, on the second end thereof. The static RAM cell design of the present invention affords improved stability relative to prior designs.

DESCRIPTION OF THE INVENTION

Figure 1:
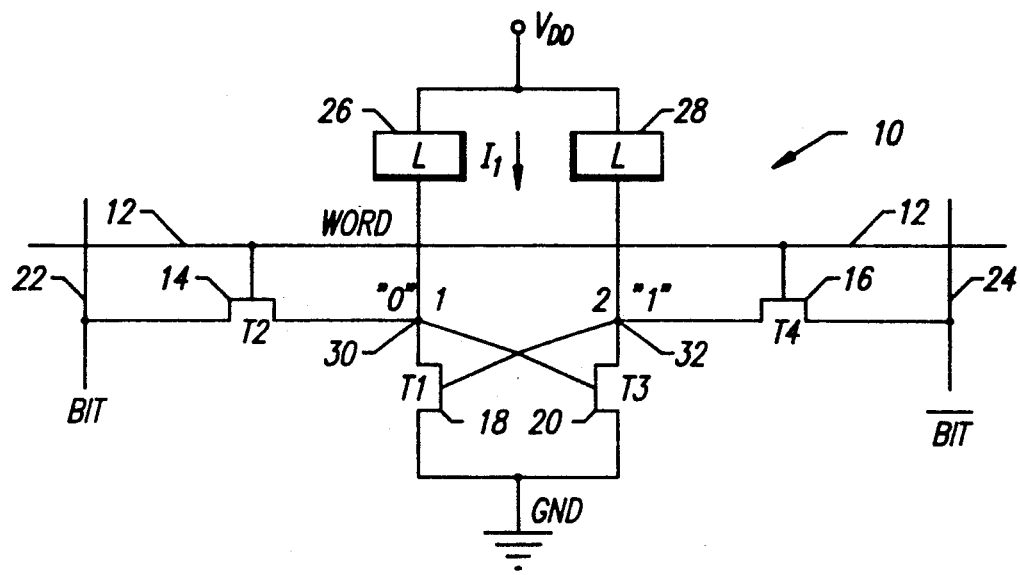
FIG. 1 is a schematic diagram of a prior art static RAM cell.

Illustrative embodiments and exemplary applications are described below with reference to the accompanying drawings to disclose the advantageous teachings of the present invention. Referring now to the drawings wherein like reference numerals designate like elements throughout, a circuit diagram of a conventional six-element FET static RAM (SRAM) cell 10 is depicted in FIG. 1. The cell 10 comprises a word line 12 to which the gates of two access transistors 14 and 16 are connected to provide access into the cell for reading or writing thereof.

A cross-coupled inverter comprising pull-down, or driver, transistors 18 and 20 is connected through the access, or transfer gate, transistors 14 and 16 to BIT line 22 and $\overline{\text{BIT}}$ line 24, respectively.

Transistors 14 and 18 share a common node 30 ("node 1"), to which a first resistive load 26 and the gate of transistor 20 are connected. Transistors 16 and 20 share a common node 32 ("node 2"), to which a second resistive load 28 and the gate of transistor 18 are connected. Nodes 1 and 2 are state nodes. Load devices 26 and 28 may comprise high value resistors (e.g., $10^9$ Ω), for example, polysilicon, or depletion mode or enhancement mode transistors, or p-transistors or other common load device.

As discussed above, data retention reliability for the design illustrated in FIG. 1 is a direct function of cell stability and noise margin. This noise margin is measured by how well the driver transistor 18 (T1) holds a logic low level. This low level must remain below the threshold voltage of transistor 20 (T3) to prevent the cell 10 from flipping. If node 1 (30) exceeds the threshold of transistor 20 (T3), then transistor 20 will conduct and easily degrade the high level on node 2 (32).

This is illustrated with reference to FIG. 1. When the cell is not being read, the word line is held low and either node 1 or node 2 is high. There is positive feedback within the cell. Thus, if node 1 is high, T3 is turned on. This pulls current from the load device 28, holding node 2 low, keeping T1 off and node 1 high.

However, a problem arises when the cell is read. In this mode, it is necessary to pull additional current through T2 or T4. If, say, node 1 is a "0", it is necessary to pull current through T2 and T1. Since node 2 is high, the word line is high and T4 is off. But T2 turns on because a gate-to-source voltage is generated between the word line and the low voltage on the drain of T1. This causes current to flow through T2 and T1. The additional current through T1 causes a voltage drop thereacross which increases the voltage at node 1 degrading the low voltage on the node. This increases the gate-to-source voltage on T3 and increases the leakage therethrough. T3 begins to sink load current which degrades the high voltage on node 2. Hence the cell goes unstable.

Figure 2:
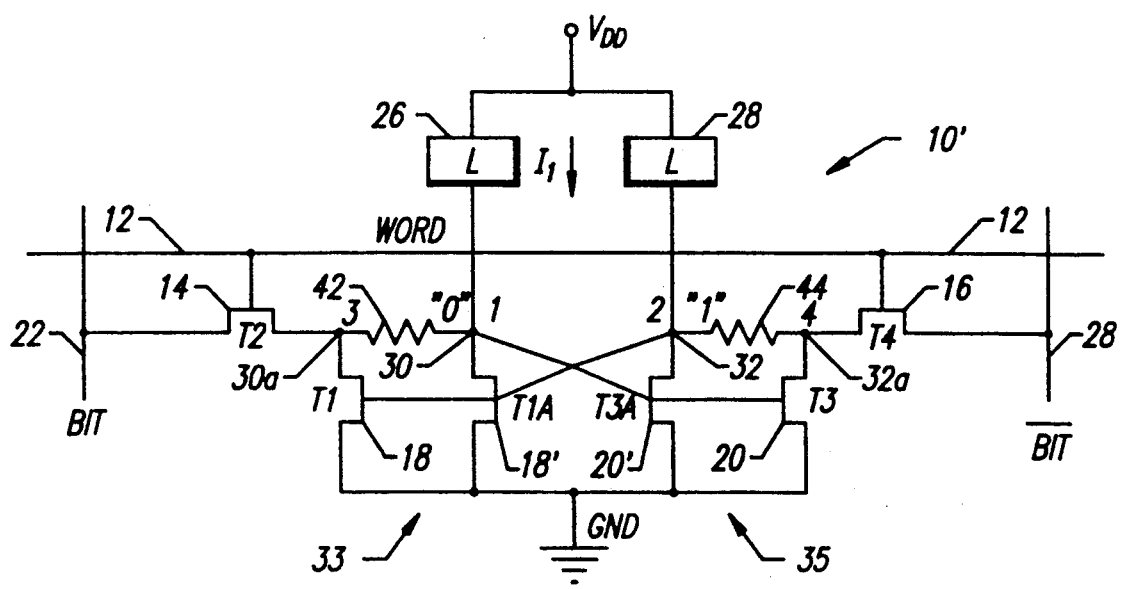
FIG. 2 is a schematic circuit diagram of static RAM cell in accordance with the teaching of Terrell.

In accordance with the above-noted Terrell patent (U.S. Pat. No. 4,995,000), the teachings of which are incorporated herein by reference, two-transistor driver elements with drain-coupled resistive isolation devices 33 and 35 are substituted in the circuit 10 to decouple stability requirements from cell pull current requirements. The modified circuit 10' of Terrell is shown in FIG. 2. The driver elements 33 and 35 replace the existing driver transistors 18 and 20, respectively. Thus, when current is pulled or dumped into T2 and T1, node 3 is pulled up. However, because of the isolation device between nodes 3 and 1, since T1A is pulling down current, a resistive divider is set up between the resistance of the resistor 42 and the "on" resistance of the transistor T1A. This keeps the gate of T3A lower than if it were tied to node 3 and minimizes leakage through T3 and T3A.

Hence, the isolation devices of Terrell allow the pull-down devices with the cell to pull substantially more current while maintaining a good low level on the cross-coupled pair. This keeps the gates of the transistors in the cross-coupled pair as negative as possible which, in turn, reduces subthreshold current (leakage) therethrough.

However, with the Terrell design, the load devices are connected to the state nodes where node information is stored as voltages. When the cell is written, current must be sunk through the isolation device to an output line. If the resistance of the isolation device is large (which is desirable for stability), then a large voltage is generated across the isolation device making it difficult to pull the node with state low enough to flip the cell. This impedes the speed of operation of the device.

Figure 3:
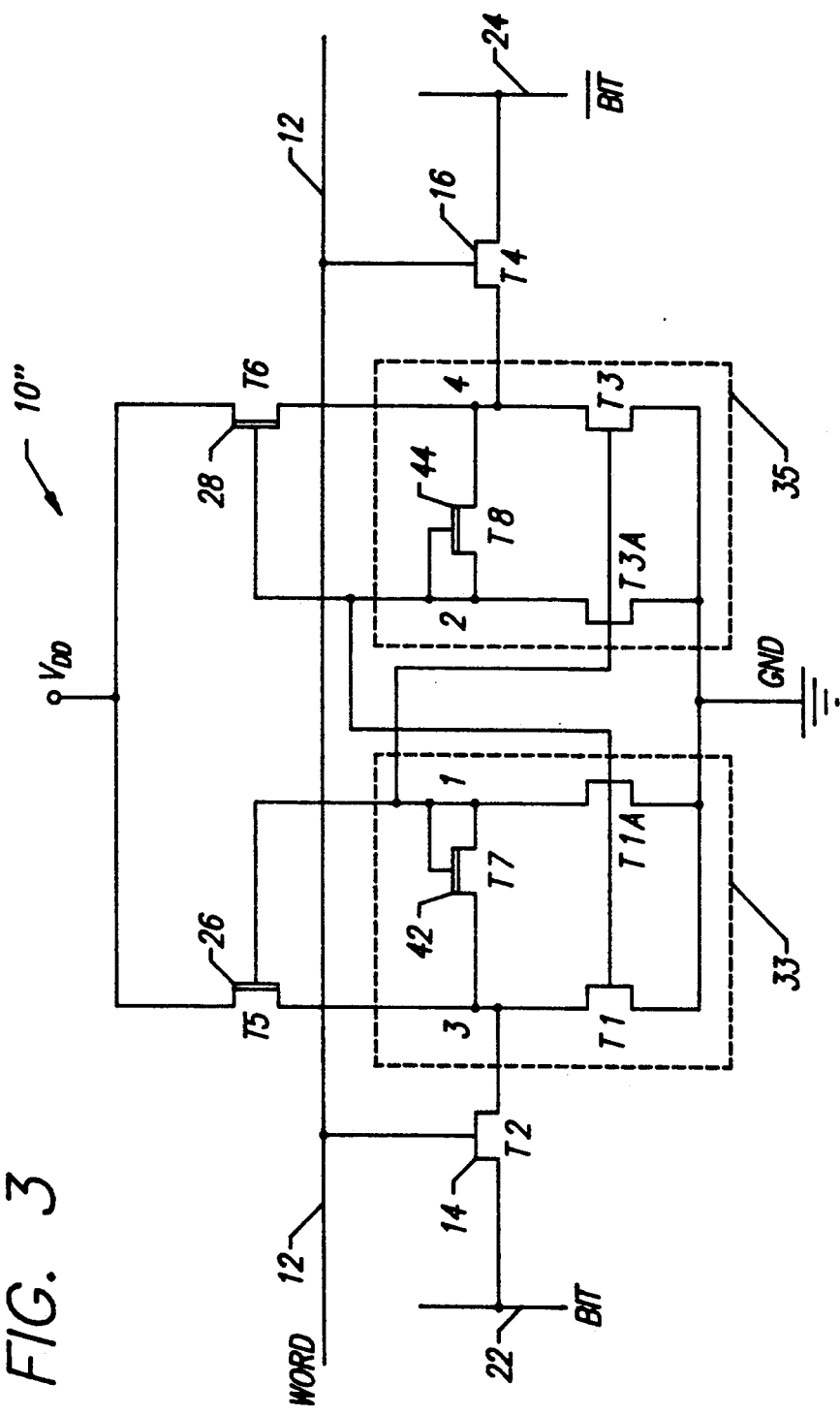
FIG. 3 is a schematic of a static RAM cell in accordance with the teaching of the present invention.

In accordance with the present teachings, the loads 26 and 28 of FIG. 2 are moved to nodes 3 and 4 as depicted in the schematic diagram of FIG. 3. The cell 10" of the present invention includes first and second driver elements (33 and 35). Each driver element has a first (T1A or T3A) and a second (T1 or T3) transistor and a resistive device (42 or 44). Each transistor has first, second and third terminals, with the second terminals being the input terminals thereof. A first terminal of the first transistor (T1A) of the first driver element (33) is connected to the resistive device (42) thereof at a first node. A first terminal of the first transistor (T3A) of the second driver element is connected to the resistive device (44) thereof at a second node. A first terminal of the second transistor (T1) of the first driver element (33) is connected to the resistive device (42) thereof at a third node. A first terminal of the second transistor (T3) of the second driver element is connected to the resistive device (44) thereof at a fourth node. The input terminals of the first and second transistors (T1A and T1) of the first driver element (33) are connected to the second node and the input terminals of the first and second transistors (T3A and T3) of the second driver element (35) are connected to the first node. The third terminals of the first and second transistors of the first and second driver elements are connected to a first source of common potential. A first load device (26) is connected to a second source of common potential on one end thereof and is connected to the third node, the outside node, on a second end thereof. Likewise, a second load device (28) is connected to the second source of common potential on one end and to the fourth node, an outside node, on the second end thereof.

In the illustrative implementation of FIG. 3, the loads 26 and 28 are implemented by transistors T5 and T6 respectively. Similarly, resistors 42 and 44 are implemented with transistors T7 and T8 respectively. Transistors T5, T6, T7 and T8 are connected in a resistive configuration.

Moving the load devices to the outside nodes, nodes 3 and 4, allows T1 to maintain a good low level while a lower voltage exists at node 1 due to the voltage divider provided by T7 and T1A. The input of T3A is held lower and the cell 10'' of the present invention is therefore more stable. That is, because the inner devices of the cross-coupled pair T1A and T3A do not have to sink the load current. This results in a lower drain-to-source voltage for the on side which implies a lower gate to source voltage for the "off" side. A lower gate-to-source voltage results in less "off" leakage and therefore better stability for a given load current.

In addition, another advantage of the design afforded by the present invention is that higher value impedance value isolation devices may be used. Returning momentarily to FIG. 2, consider that node 2 is typically at one diode voltage drop (0.6 volts) above ground. To write a zero to that side of the cell, load current must be sunk and pulled out through the isolation device, through T4 to the $\overline{\text{BIT}}$ line 24. If the $\overline{\text{BIT}}$ line 24 is pulled to ground, node 1 must be pulled down below the trip point of the cell (0–0.6 volts, typically 0.2 volts). If the resistance of the resistor 44 is too high, the voltage drop thereacross due to the load current will be high making it difficult to pull the node, node 2, low.

However, movement of the load to node 4 allows for a sinking of the load current through T4. There is no static current in the load device. Thus, the limit on the impedance of the isolation devices is removed and the impedance of isolation devices to be arbitrarily increased in impedance to reduce the gate-to-source voltage to approximately zero volts. In general, the device values will be limited only by physical size.

A third advantage of the design of the present invention results from an improvement in stability afforded by the connection of the gates of the load devices to the inner nodes of the cross-coupled compound device pair. This is due to the fact that the load current is modulated by the voltage across the isolation device. As the read current through devices T2 and T4 generates drain-to-source voltage across the outer device of the compound pair, the load device is turned off, reducing he total current that the pull down device must sink for a given read current. As shown in FIG. 3, the pass-gate transistor T2 connects the BIT line 22 to node 3, when the word line 12 is selected. Also the pass-gate transistor T4 connects the $\overline{\text{BIT}}$ line 24 to node 4, when the word line 12 is selected.

A further performance improvement may be realized by substituting depletion field-effect-transistors for resistors as isolation devices. This allows a substantial increase in isolation device impedance in a smaller area.

INDUSTRIAL APPLICABILITY

The present invention is expected to find immediate use in GaAs FET-based static RAM cells.

Thus, the present invention has been described herein with reference to an illustrative embodiment and an illustrative application. Those having ordinary skill in the art and access to the present teachings will recognize additional modifications applications and embodiments within scope thereof. For example, the isolation circuits of the invention have been described in terms of a GaAs FET-based static RAM 4T cell. However, it will be clear to one of ordinary skill in the art that the invention could be employed in well-known variants of such cells. Further, the invention may be used in other III-V-based materials systems, as well as in silicon-based cells. Finally, the invention may be utilized in CMOS, MOSFET, MESFET, bipolar, and other circuits.

It is therefore intended by the appended claims to cover any and all such applications, modifications and embodiments within the spirit and scope of the present invention.

Accordingly,

What is claimed is:

1. An improved static RAM cell comprising:
   first and second driver elements (33 and 35), each element having a first (T1A or T3A) and a second (T1 or T3) transistor and resistive means (42 or 44) for providing a resistance, each transistor having first, second and third terminals, said second terminals being the input terminals thereof, a first terminal of said first transistor (T1A) of said first driver element (33) being connected to the resistive means (42) thereof at a first node and a first terminal of said first transistor (T3A) of said second driver element being connected to the resistive means (44) thereof at a second node, a first terminal of said second transistor (T1) of said first driver element (33) being connected to the resistive means (42) thereof at a third node and a first terminal of said second transistor (T3) of said second driver element being connected to the resistive means (44) thereof at a fourth node, said input terminals of said first and second transistors (T1A and T1) of said first driver element (33) being connected to said second node and said input terminals of said first and second transistors (T3A and T3) of said second driver element (35) being connected to said first node, and said third terminals of said first and second transistors of said first and second driver elements being connected to a first source of common potential;
   a first load device (26), connected to a second source of common potential on one end thereof and being connected to said third node on a second end thereof and
   a second load device (28), connected to said second source of common potential on one end and to said fourth node on the second end thereof.

2. The invention of claim 1 further including first passgate means (T2) for selectively connecting said third node to a first input/output line (22).

3. The invention of claim 2 further including second passgate means (T4) for selectively connecting said fourth node to a second input/output line (24).

4. The invention of claim 3 wherein said first and second passgate means have a common input line 12.

5. The invention of claim 4 wherein said first load device (26) is a transistor (T5) having a first terminal connected to said second source of common potential, a second terminal being the input terminal thereof and connected to said first node, and a third terminal being connected to said third node.

6. The invention of claim 5 wherein said second load device (28) is a transistor (T6) having a first terminal connected to said second source of common potential, a second terminal being the input terminal thereof and connected to said second node, and a third terminal being connected to said fourth node.

7. The invention of claim 6 wherein said resistive means (42) of said first driver element (33) is a transistor (T7) having a first terminal connected to said first node, a second terminal being the input terminal thereof and being connected to said first node, and a third terminal connected to said third node.

8. The invention of claim 7 wherein said resistive means (44) of said second driver element (35) is a transistor (T8) having a first terminal connected to said second node, a second terminal being the input terminal thereof and being connected to said second node, and a third terminal connected to said fourth node.

9. The invention of claim 8 wherein said transistors of said first and second driver elements are field effect transistors.

10. The invention of claim 9 wherein said transistors of said first and second driver elements are depletion mode field effect transistors.

11. An improved static RAM cell comprising:
first and second isolation devices (33 and 35), each device having a first (T1A or T3A) and a second (T1 or T3) transistor and resistive means (42 or 44) for providing a resistance, each transistor having first, second and third terminals, said second terminals being the input terminals thereof, a first terminal of said first transistor (T1A) of said first driver element (33) being connected to the resistive means (42) thereof at a first node and a first terminal of said first transistor (T3A) of said second driver element being connected to the resistive means (44) thereof a second node, a first terminal of said second transistor (T1) of said first driver element (33) being connected to the resistive means (42) thereof at a third node and a first terminal of said second transistor (T3) of said second driver element being connected to the resistive means (44) thereof at a fourth node, said input terminals of said first and second transistors (T1A and T1) of said first driver element (33) being connected to said second node and said input terminals of said first and second transistors (T3A and T3) of said second driver element (35) being connected to said first node, and said third terminals of said first and second transistors of said first and second driver elements being connected to a first source of common potential, said resistive means (42) of said first driver element (33) being a transistor (T7) having a first terminal connected to said first node, a second terminal being the input terminal thereof and being connected to said first node, and a third terminal connected to said third node and said resistive means (44) of said second driver element (35) being a transistor (T8) having a first terminal connected to said second node, a second terminal being the input terminal thereof and being connected to said second node, and a third terminal connected to said fourth node;

a first load device (26) connected to a second source of common potential on one end thereof and being connected to said third node on a second end thereof, said first load device (26) being a transistor (T5) having a first terminal connected to said second source of common potential, a second terminal being the input terminal thereof and connected to said first node, and a third terminal being connected to said third node;

a second load device (28) connected to said second source of common potential on one end and to said fourth node on the second end thereof, said second load device (28) being a transistor (T6) having a first terminal connected to said second source of common potential, a second terminal being the input terminal thereof and connected to said second node, and a third terminal being connected to said fourth node;

first passgate means (T2) for selectively connecting said third node to a first input/output line (22); and second passgate means (T4) for selectively connecting said fourth node to a second input/output line (24).

12. The invention of claim 11 wherein said transistors of said first and second isolation devices are field effect transistors.

13. The invention of claim 12 wherein said transistors of said first and second isolation devices are depletion mode field effect transistors.

* * * * *